United States Patent
Kim et al.

(10) Patent No.: US 8,946,694 B2
(45) Date of Patent: Feb. 3, 2015

(54) ORGANIC LIGHT EMITTING DISPLAY DEVICE WITH INSULATED BALANCE ELECTRODE

(71) Applicant: Samsung Display Co., Ltd., Yongin, Gyeonggi-Do (KR)

(72) Inventors: Kiseo Kim, Gongju-si (KR); Daesung Choi, Seongnam-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/781,946

(22) Filed: Mar. 1, 2013

(65) Prior Publication Data

US 2014/0042401 A1 Feb. 13, 2014

(30) Foreign Application Priority Data

Aug. 9, 2012 (KR) .......................... 10-2012-0087369

(51) Int. Cl.
*H01L 51/00* (2006.01)

(52) U.S. Cl.
USPC ...................... 257/40; 257/E51.001; 257/642

(58) Field of Classification Search
CPC .................. H01L 51/5212; H01L 51/5203
USPC ............................... 257/4, E51.001
See application file for complete search history.

(56) References Cited

U.S. PATENT DOCUMENTS 7,777,408 B2 8/2010 Lee et al.
2012/0097989 A1 4/2012 Lee et al.

FOREIGN PATENT DOCUMENTS

| KR | 100646514 | 11/2006 |
| KR | 100757798 | 9/2007 |
| KR | 1020080062310 | 7/2008 |
| KR | 10-2010-0064868 | * 6/2010 |

OTHER PUBLICATIONS

English machine translation of KR10-2010-0064868.*

* cited by examiner

*Primary Examiner* — Eva Yan Montalvo
(74) *Attorney, Agent, or Firm* — Robert E. Bushnell, Esq.

(57) ABSTRACT

An organic light emitting display device includes a substrate, a light emitting diode disposed on the substrate, and a balance electrode insulated from the light emitting diode and from each of the first and second electrodes. The light emitting diode includes a first electrode, a second electrode facing the first electrode, and an organic light emitting layer disposed between the first electrode and the second electrode. The balance electrode maintains a hole-electron charge balance within the organic light emitting layer by varying the amount of electrons and holes that are injected into the organic light emitting layer from the first and second electrodes by varying an electric potential applied to the balance electrode.

20 Claims, 4 Drawing Sheets

ORGANIC LIGHT EMITTING DISPLAY DEVICE WITH INSULATED BALANCE ELECTRODE

CLAIM OF PRIORITY

This U.S. non-provisional patent application claims priority under 35 U.S.C. §119 of Korean Patent Application No. 10-2012-0087369, filed on Aug. 9, 2012, the content of which is herein incorporated by reference.

BACKGROUND OF THE INVENTION

1. Field of the Invention

The present disclosure relates to an organic light emitting display device capable of improving light emitting efficiency.

2. Description of the Related Art

In an organic light emitting display device, a hole and an electron are injected into an organic light emitting layer through an anode and a cathode, and are recombined in the organic light emitting layer to generate an exciton. The exciton emits energy when an excited state returns to a ground state as light.

In general, there is a difference in mobility between the hole and the electron. The mobility of the hole from the anode is greater than that of the electron from the cathode. Accordingly, due to the difference in mobility between the hole and the electron, a hole-electron charge balance is lost in the organic light emitting layer. When the hole-electron charge balance is lost, the number of electron-hole pairs that recombine is less than a total amount of electric charges injected into the organic light emitting layer, and the electric charges which are not recombined exist in the organic light emitting layer. As a result, a light emitting efficiency of the organic light emitting display device is lowered.

SUMMARY OF THE INVENTION

The present disclosure provides an organic light emitting display device capable of improving light emitting efficiency in association with a hole-electron charge balance in an organic light emitting layer.

According to one aspect of the present invention, there is provided an organic light emitting display device that includes a substrate, a light emitting diode that includes a first electrode disposed on the substrate, a second electrode facing the first electrode, and an organic light emitting layer disposed between the first electrode and the second electrode and a balance electrode insulated from the light emitting diode to maintain a hole-electron charge balance in the organic light emitting layer. The organic light emitting display may also include an insulating layer disposed between the substrate and the light emitting diode, wherein the balance electrode is disposed between the substrate and the insulating layer. The first electrode may have a first electric potential, the second electrode has a second electric potential different from the first electric potential, and the balance electrode has a third electric potential different from either of the first and second electric potentials. The third electric potential may be higher than the second electric potential.

The organic light emitting display may also include an insulating layer disposed on the light emitting diode, wherein the balance electrode is disposed on the insulating layer. The balance electrode may include at least one of indium tin oxide, indium zinc oxide, aluminum zinc oxide, gallium-doped zinc oxide, zinc tin oxide, gallium tin oxide and fluorine-doped tin oxide. The balance electrode may instead include at least one of Mo, MoW, Cr, Al, AlNd and Al alloy. The balance electrode may serves to maintain electron-hole charge balance within the organic light emitting layer by varying an amount of holes injected into the organic light emitting layer from the first electrode and an amount of electrons injected into the organic light emitting layer from the second electrode by varying an electric potential applied to the balance electrode. The balance electrode may serves to maintain electron-hole charge balance within the organic light emitting layer by decreasing an amount of holes injected into the organic light emitting layer from the first electrode and increasing an amount of electrons injected into the organic light emitting layer from the second electrode by applying an electric potential to the balance electrode that is higher than an electric potential being applied to the second electrode.

According to another aspect of the present invention, there is provided an organic light emitting display device that includes a substrate and a light emitting diode that includes a first electrode layer disposed on the substrate, a second electrode layer facing the first electrode layer, and an organic light emitting layer disposed between the first electrode layer and the second electrode layer, wherein one of the first electrode layer and the second electrode layer includes a charge supply electrode that supplies an electric charge to the organic light emitting layer and a balance electrode spaced apart from the charge supply electrode to maintain a hole-electron charge balance within the organic light emitting layer. The organic light emitting display may also include an insulating layer to insulate the balance electrode from the charge supply electrode and the organic light emitting layer. The first electrode layer may include the charge supply electrode and the balance electrode. The charge supply electrode may have a first electric potential, the second electrode layer have a second electric potential different from the first electric potential, and the balance electrode may have a third electric potential different from either of the first and second electric potentials. The third electric potential may be higher than the second electric potential.

The second electrode layer may include the charge supply electrode and the balance electrode. The balance electrode may include at least one of indium tin oxide, indium zinc oxide, aluminum zinc oxide, gallium-doped zinc oxide, zinc tin oxide, gallium tin oxide and fluorine-doped tin oxide. The balance electrode may instead include at least one of Mo, MoW, Cr, Al, AlNd and Al alloy. The charge supply electrode and the balance electrode may be disposed on a same layer and are comprised of a same material. The balance electrode may serve to maintain electron-hole charge balance within the organic light emitting layer by varying an amount of holes injected into the organic light emitting layer from the first electrode and an amount of electrons injected into the organic light emitting layer from the second electrode by varying an electric potential applied to the balance electrode. The balance electrode may serve to maintain electron-hole charge balance within the organic light emitting layer by decreasing an amount of holes injected into the organic light emitting layer from the first electrode and increasing an amount of electrons injected into the organic light emitting layer from the second electrode by applying an electric potential to the balance electrode that is higher than an electric potential being applied to the second electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
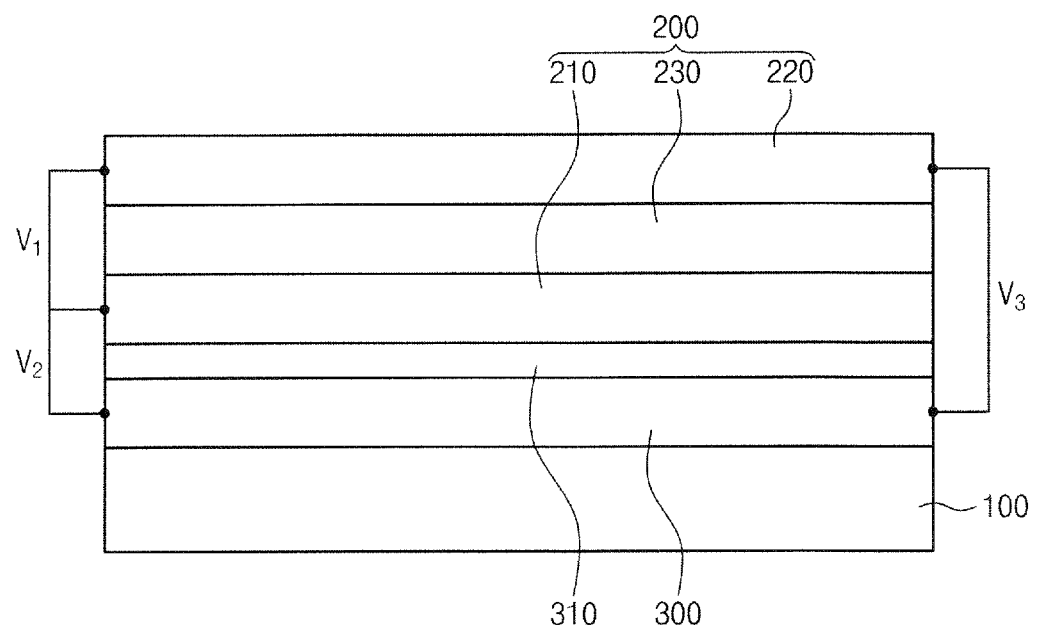
FIG. 1 is a cross-sectional view showing an organic light emitting display device according to a first embodiment of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
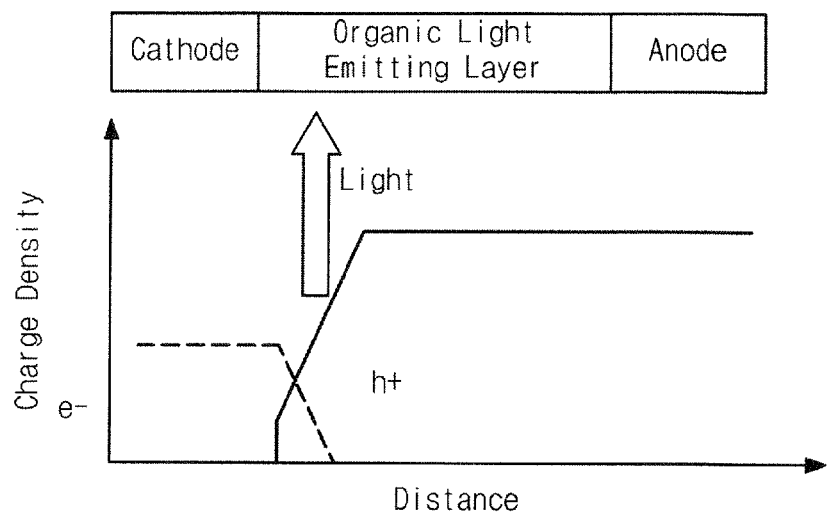
FIG. 2 is a view showing an amount of light emission when a hole-electron charge balance is lost in an organic light emitting layer.
Figure 3:
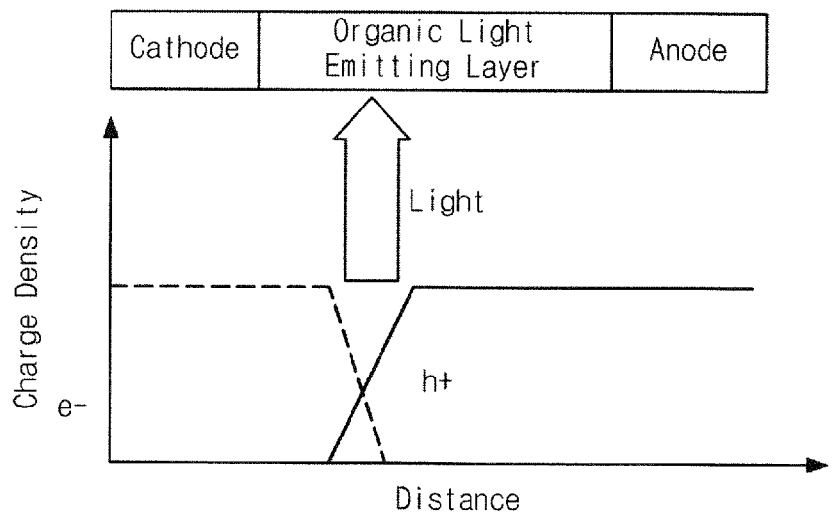
FIG. 3 is a view showing an amount of light emission when a hole-electron charge balance is maintained in an organic light emitting layer.

Turning now to FIGS. 1-3, FIG. 1 is a cross-sectional view showing an organic light emitting display device according to a first exemplary embodiment of the present invention, FIG. 2 is a view showing an amount of light emission when a hole-electron charge balance is lost in an organic light emitting layer, and FIG. 3 is a view showing an amount of light emission when a hole-electron charge balance is maintained in an organic light emitting layer.

Referring to FIGS. 1 to 3, the organic light emitting display device includes a substrate 100, a light emitting diode 200 disposed on the substrate 100, and a balance electrode 300 disposed between the substrate 100 and the light emitting diode 200 and being insulated from the light emitting diode 200.

The substrate 100 includes a transparent insulating material. For instance, the substrate 100 may be a rigid type substrate formed of glass or a polymer such as plastic. In the case that the substrate 100 is the plastic substrate, the substrate 100 may include polyethylene terephthalate (PET), fiber reinforced plastic (FRP), or polyethylene naphthalate (PEN). In addition, the substrate 100 may be a transparent flexible type insulating substrate.

The light emitting diode 200 includes a first electrode 210 disposed on the substrate 100, a second electrode 220 facing the first electrode 210, and an organic light emitting layer 230 disposed between the first electrode 210 and the second electrode 220. One of the first electrode 210 and the second electrode 220 is an anode and the other one of the first electrode 210 and the second electrode 220 is cathode.

In addition, at least one of the first electrode 210 or the second electrode 220 may be an optically transparent electrode. For instance, when the organic light emitting display device is a rear surface light emitting type display device, the first electrode 210 is transparent and the second electrode 220 is reflective. In the present exemplary embodiment, the first electrode 210 may include a transparent conductive oxide, such as indium tin oxide, indium zinc oxide, aluminum zinc oxide, gallium-doped zinc oxide, zinc tin oxide, gallium tin oxide, or fluorine-doped tin oxide. In addition, the second electrode 220 may reflect light and include at least one of Mo, MoW, Cr, Al, AlNd, or Al alloy.

When the organic light emitting display device is a front surface light emitting type display device, the first electrode 210 is the reflection-type electrode and the second electrode 220 is an optically transparent electrode. In addition, when the organic light emitting display device is a dual or both surface light emitting type display device, both of the first electrode 210 and the second electrode 220 are optically transparent.

The organic light emitting layer 230 includes at least a light emitting layer and may have a multi-layer structure. In detail, the organic light emitting layer 230 includes a hole injection layer that injects holes, a hole transport layer that controls movement of the electrons to enhance an opportunity of recombination between the holes and electrons, the emitting layer that emits light according to the recombination between the holes and electrons, which are injected to the emitting layer, a hole blocking layer that controls movement of the holes not recombined with the electrons, an electron transport layer that transports the electrons to the emitting layer, and an electron injection layer that injects the electrons.

The organic light emitting layer 230 includes a low molecular weight or high molecular weight organic material. The organic light emitting layer 230 may include copper phthalocyanine (CPC), N,N'-Di(naphthalene-1-yl)-,N'-diphenyl-benzidine (NPB), or tris-8-hydroxyquinoline aluminum (Alq3) as the low molecular weight organic material. In addition, the organic light emitting layer 230 may include poly-(2,4)-ethylene-dihydroxy thiophene (PEDOT) or polyaniline (PANI) as the high molecular weight organic material. In addition, in the case when the high molecular weight organic material is used as the emitting layer of the organic light emitting layer 230, the emitting layer may include one of poly(phenylene vinylene) (PPV), soluble poly (phenylene vinylene) (PPV), cyano-substituted poly(phenylene vinylene) (CN-PPV), or polyfluorene (PFO).

The emitting layer may be a stack type or a tandem type. The stack type emitting layer is configured to include red, green, and blue sub-emitting layers, and a stack order of the red, green, and blue sub-emitting layers should not be limited to a specific order. In the stack type emitting layer and the tandem type emitting layer, all of the red, green, and blue sub-emitting layers is a fluorescent emitting layer or at least one sub-emitting layer is a phosphorescence emitting layer. In addition, emitting layers disposed at both sides of a charge generation layer of the tandem type emitting layer emit a white color light, a different color light, or a same color light, and the color light is a monochromatic or polychromatic light.

The balance electrode 300 controls a balance between electric charges injected to the organic light emitting layer 230 from the first electrode 210 and the second electrode 220, e.g., the holes and the electrons. The balance electrode 300 is insulated from the light emitting diode 200 by an insulating layer 310 disposed between the balance electrode 300 and the light emitting diode 200. The insulating layer 310 may be an organic or inorganic material.

The balance electrode 300 has a property depending on the light emission mechanism of the light emitting diode 200. For instance, when the organic light emitting display device is a rear surface light emitting-type display device or a both surface light emitting type display device, the balance electrode 300 is optically transparent. In this case, the balance electrode 300 includes the transparent conductive oxide, such as indium tin oxide, indium zinc oxide, aluminum zinc oxide, gallium-doped zinc oxide, zinc tin oxide, gallium tin oxide, or fluorine-doped tin oxide.

In addition, when the organic light emitting display device is a front surface light emitting type display device, the balance electrode 300 reflects the light. In this case, the balance electrode 300 includes at least one of Au, Ag, Ni, Mo, MoW, Cr, Al, AlNd, or Al alloy.

Hereinafter, an operation of the organic light emitting display device will be described. When a source voltage is applied to the first electrode 210 and the second electrode 220, an electric potential difference occurs between the first electrode 210 and the second electrode 220. For instance, the first electrode 210 has a first electric potential, the second electrode 220 has a second electric potential different from the first electric potential, and the electric potential difference between the first electrode 210 and the second electrode 220 is defined as a first voltage V1. When the electric potential difference corresponding to the first voltage V1 occurs, the holes are injected into the organic light emitting layer 230 from the first electrode 210 and the electrons are injected into the organic light emitting layer 230 from the second electrode 220. The holes injected into the organic light emitting layer 230 are recombined with the electrons injected into the organic light emitting layer 230 so as to generate excitons. The excitons emit photon light energy when an excited state returns to a ground state. In this case, since the mobility of the holes is greater than the mobility of the electrons, the amount of the holes is greater than the amount of the electrons in the organic light emitting layer 230 as shown in FIG. 2, and thus a region in which the holes recombine with the electrons is located adjacent to the second electrode 220.

In addition, when the number of the holes is higher than the number of the electrons in the organic light emitting layer 230, some of the holes are not recombined with the electrons. Accordingly, the amount of electron-hole pairs that recombine is less than a total amount of electric charges injected into the organic light emitting layer 230, thereby causing decrease in light emitting efficiency. Therefore, there is a need to provide and maintain a hole-electron charge balance by adjusting the amount of holes and electrons injected into the organic light emitting layer 230.

Meanwhile, when a source voltage is applied to the balance electrode 300 in order to maintain the hole-electron charge balance, the balance electrode 300 has a third electric potential different from the first and second electric potentials. Thus, the electric potential difference corresponding to a second voltage V2 occurs between the first electrode 210 and the balance electrode 300, and the electric potential difference corresponding to a third voltage V3 occurs between the second electrode 220 and the balance electrode 300.

The amount of holes injected into the organic light emitting layer 230 from the first electrode 210 is proportional to a sum of the first voltage V1 and the second voltage V2, and the amount of the electrons injected into the organic light emitting layer 230 from the second electrode 220 is proportional to a sum of the first voltage V1 and the third voltage V3. Thus, in a case where the third electric potential of the balance electrode 300 is higher than the second electric potential of the second electrode 220, the amount of holes injected into the organic light emitting layer 230 from the first electrode 210 is decreased and the amount of electrons injected into the organic light emitting layer 230 from the second electrode 220 is increased. On the contrary, in a case where the third electric potential of the balance electrode 300 is lower than the second electric potential of the second electrode 220, the amount of holes injected into the organic light emitting layer 230 from the first electrode 210 is increased and the amount of electrons injected into the organic light emitting layer 230 from the second electrode 220 is decreased.

Therefore, when the third electric potential of the balance electrode 300 is controlled to be higher than the second electric potential of the second electrode 220, the hole-electron charge balance may be maintained in the organic light emitting layer 230 as shown in FIG. 3. Accordingly, the holes are recombined with the electrons in proportion to the total amount of electric charges injected into the organic light emitting layer 230, and thus the light emitting efficiency of the organic light emitting display device may be optimized.

Figure 4:
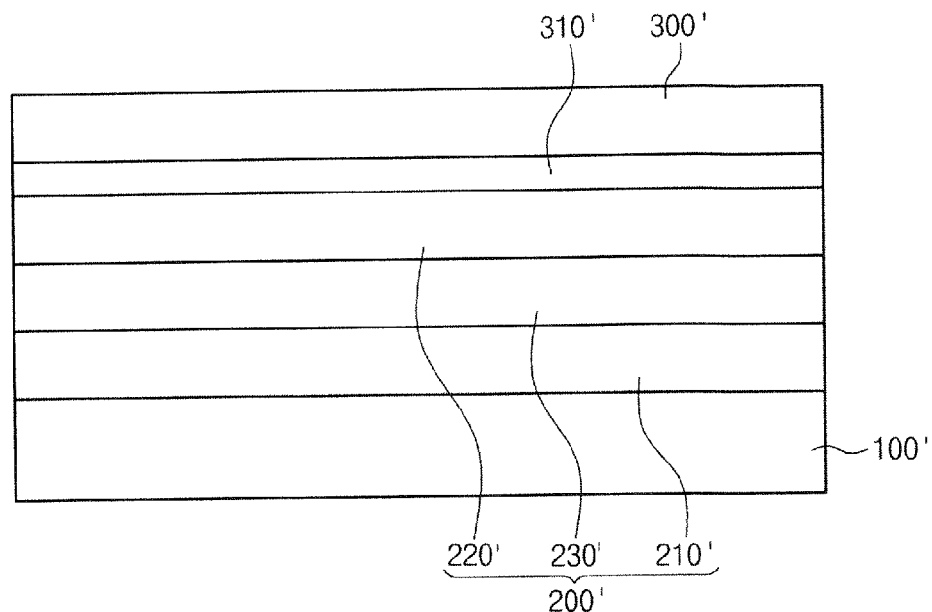
FIG. 4 is a cross-sectional view showing an organic light emitting display device according to a second exemplary embodiment of the present invention.
Figure 5:
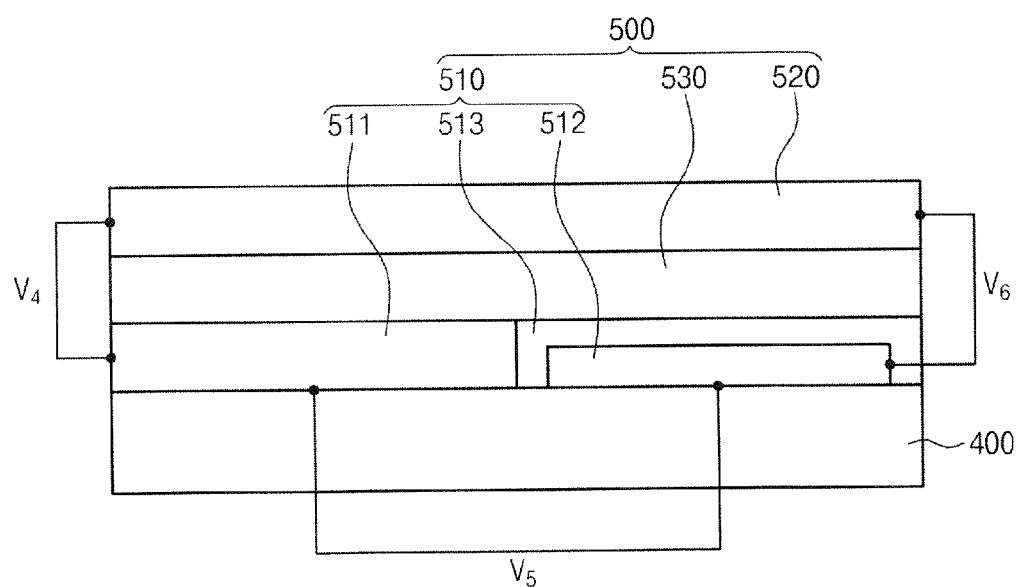
FIG. 5 is a cross-sectional view showing an organic light emitting display device according to a third exemplary embodiment of the present invention.
Figure 6:
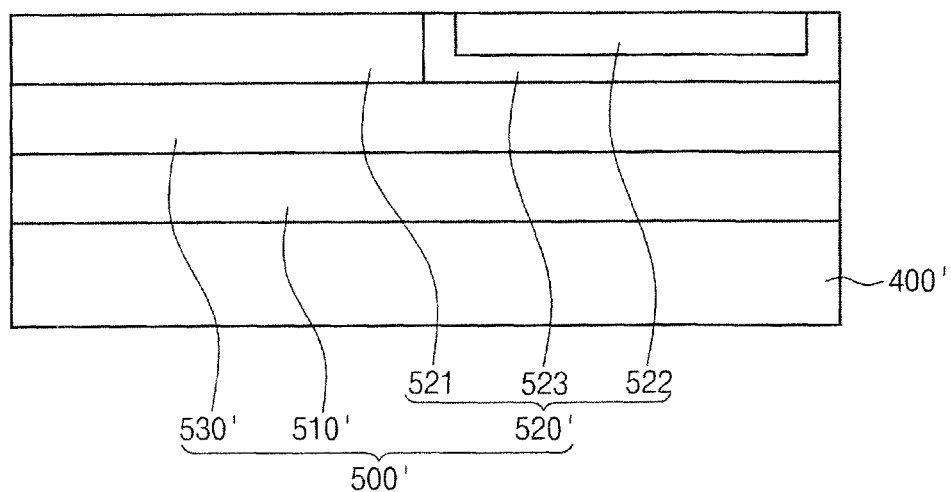
FIG. 6 is a cross-sectional view showing an organic light emitting display device according to a fourth exemplary embodiment of the present invention.

Hereinafter, organic light emitting display devices according to exemplary embodiments will be described in detail. In FIGS. 4 to 6, the same reference numerals denote the same elements in FIG. 1, and thus detailed descriptions of the same elements will be omitted.

Turning now to FIG. 4, FIG. 4 is a cross-sectional view showing an organic light emitting display device according to a second exemplary embodiment of the present invention. Referring to FIG. 4, the organic light emitting display device includes a substrate 100', a light emitting diode 200' disposed on the substrate 100', an insulating layer 310' disposed on the light emitting diode 200', and a balance electrode 300' disposed on the light emitting diode 200' and being insulated from the light emitting diode 200' by the insulating layer 310'. The light emitting diode 200' includes a first electrode 210' disposed on the substrate 100', a second electrode 220' facing the first electrode 210', and an organic light emitting layer 230' disposed between the first electrode 210' and the second electrode 220'.

The organic light emitting display device controls a source voltage applied to the balance electrode 300' to increase the amount of electrons injected into the organic light emitting layer 230', to thereby maintain a hole-electron charge balance within the organic light emitting layer 230'. Accordingly, holes are recombined with electrons in proportion to the total amount of the electric charge injected into the organic light emitting layer 230', and thus the light emitting efficiency in the organic light emitting display device may be optimized.

Turning now to FIG. 5, FIG. 5 is a cross-sectional view showing an organic light emitting display device according to a third exemplary embodiment of the present invention. Referring to FIG. 5, the organic light emitting display device includes a substrate 400 and a light emitting diode 500 disposed on the substrate 400. The light emitting diode 500 includes a first electrode layer 510 disposed on the substrate 400, a second electrode layer 520 facing the first electrode layer 510, and an organic light emitting layer 530 disposed between the first electrode layer 510 and the second electrode layer 520.

The first electrode layer 510 includes a charge supply electrode 511 supplying charges, e.g., holes, to the organic light emitting layer 530, a balance electrode 512 disposed on the same layer in which the charge supply electrode 511 is disposed, and an insulating layer 513 covering the balance electrode 512.

One of the charge supply electrode 511 and the second electrode layer 520 is an anode electrode and the other one of the charge supply electrode 511 and the second electrode layer 520 is a cathode electrode. In addition, at least one of the charge supply electrode 511 and the second electrode layer 520 is optically transparent.

The balance electrode 512 controls the balance between electric charges, e.g., holes and electrons that have been injected into the organic light emitting layer 530 from the charge supply electrode 511 and the second electrode layer 520. In addition, the balance electrode 512 is disposed to be spaced apart from the charge supply electrode 511 by a predetermined distance, and the insulating layer 513 covers the balance electrode 512. Accordingly, the balance electrode 512 is insulated from the charge supply electrode 511 and the organic light emitting layer 530.

The balance electrode 512 has a property depending on the light emission mechanism of the light emitting diode 500. For instance, when the organic light emitting display device is the rear surface light emitting-type display device or the dual surface light emitting type display device, the balance electrode 512 is transparent. In addition, when the organic light emitting display device is the front surface light emitting type display device, the balance electrode 300 is the reflective.

The second electrode layer 520 is formed of a conductive material, and thus the second electrode layer 520 supplies electrons to the organic light emitting layer 530, which have an opposite polarity to that of the charges supplied to the organic light emitting layer 530 from the charge supply electrode 511.

Hereinafter, an operation of the organic light emitting display device will be described in detail. When source voltages are applied to the charge supply electrode 511, the second electrode layer 520, and the balance electrode 512, the charge supply electrode 511 has a fourth electric potential, the second electrode layer 520 has a fifth electric potential, and the balance electrode 512 has a sixth electric potential. In the present exemplary embodiment, the electric potential difference between the charge supply electrode 511 and the second electrode layer 520 is referred to as a fourth voltage V4, the electric potential difference between the charge supply electrode 511 and the balance electrode 512 is referred to as a fifth voltage V5, and the electric potential difference between the second electrode layer 520 and the balance electrode 512 is referred to as a sixth voltage V6.

The amount of holes injected into the organic light emitting layer 530 from the charge supply electrode 511 is proportional to a sum of the fourth voltage V4 and the fifth voltage V5, and the amount of electrons injected into the organic light emitting layer 530 from the second electrode layer 520 is proportional to a sum of the fourth voltage V4 and the sixth voltage V6.

Thus, in a case that the sixth electric potential of the balance electrode 512 is higher than the fifth electric potential of the second electrode layer 520, the amount of holes injected into the organic light emitting layer 530 from the charge supply electrode 511 is decreased and the amount of electrons injected into the organic light emitting layer 530 from the second electrode layer 520 is increased. On the contrary, in a case that the sixth electric potential of the balance electrode 512 is lower than the fifth electric potential of the second electrode layer 520, the amount of holes injected into the organic light emitting layer 530 from the charge supply electrode 511 is increased and the amount of electrons injected into the organic light emitting layer 530 from the second electrode layer 520 is decreased.

Therefore, when the sixth electric potential of the balance electrode 512 is controlled to be higher than the fifth electric potential of the second electrode layer 520, the hole-electron charge balance within the organic light emitting layer 530 may be maintained. Accordingly, the holes are recombined with the electrons in proportion to the total amount of electric charge injected into the organic light emitting layer 530, and thus the light emitting efficiency in the organic light emitting display device may be optimized.

Turning now to FIG. 6, FIG. 6 is a cross-sectional view showing an organic light emitting display device according to a third exemplary embodiment of the present invention. Referring now to FIG. 6, the organic light emitting display device includes a substrate 400' and a light emitting diode 500' disposed on the substrate 400'.

The light emitting diode 500' includes a first electrode layer 510' disposed on the substrate 400', a second electrode layer 520' facing the first electrode layer 510', and an organic light emitting layer 530' disposed between the first electrode layer 510' and the second electrode layer 520'.

The first electrode layer 510' is formed of a conductive material and supplies electric charges, e.g., holes, to the organic light emitting layer 530'. The second electrode layer 520' includes a charge supply electrode 521 and a balance electrode 522 disposed on the same layer on which the charge supply electrode 521 is disposed. The balance electrode 522 is insulated from the charge supply electrode 521 and the organic light emitting layer 530'. The charge supply electrode 521 supplies electrons to the organic light emitting layer 530', which have an opposite polarity to that of the charges supplied to the organic light emitting layer 530' from the first electrode layer 510'.

The organic light emitting display device controls the source voltage applied to the balance electrode 522 to increase the amount of the electrons injected into the organic light emitting layer 530', so that the hole-electron charge balance within the organic light emitting layer 530' may be maintained. Accordingly, holes are recombined with electrons in proportion to the total amount of the electric charges injected into the organic light emitting layer 530', and thus the light emitting efficiency in the organic light emitting display device may be improved.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An organic light emitting display device, comprising:
    a substrate;
    a light emitting diode that includes a first electrode disposed on the substrate, a second electrode facing the first electrode, and an organic light emitting layer disposed between the first electrode and the second electrode; and
    a balance electrode insulated from the light emitting diode to maintain a hole-electron charge balance in the organic light emitting layer.

2. The organic light emitting display device of claim 1, further comprising an insulating layer disposed between the substrate and the light emitting diode, wherein the light emitting diode is spaced-apart from the balance electrode by the insulating layer.

3. The organic light emitting display device of claim 2, wherein the first electrode has a first electric potential, the second electrode has a second electric potential different from the first electric potential, and the balance electrode has a third electric potential different from either of the first and second electric potentials.

4. The organic light emitting display device of claim 3, wherein the third electric potential is higher than the second electric potential.

5. The organic light emitting display device of claim 1, further comprising an insulating layer disposed on the light emitting diode, wherein the balance electrode is disposed on the insulating layer and is spaced-apart from the light emitting diode by the insulating layer.

6. The organic light emitting display device of claim 1, wherein the balance electrode comprises at least one material selected from a group consisting of indium tin oxide, indium zinc oxide, aluminum zinc oxide, gallium-doped zinc oxide, zinc tin oxide, gallium tin oxide and fluorine-doped tin oxide.

7. The organic light emitting display device of claim 1, wherein the balance electrode comprises at least one material selected from a group consisting of Mo, MoW, Cr, Al, AlNd and Al alloy.

8. An organic light emitting display device, comprising:
    a substrate; and
    a light emitting diode including a first electrode arranged on the substrate, a second electrode facing the first electrode, and an organic light emitting layer arranged between the first electrode and the second electrode; and
    a balance electrode spaced apart and electrically insulated from each of the first and second electrodes, the balance electrode to maintain a hole-electron charge balance within the organic light emitting layer.

9. The organic light emitting display device of claim 8, further comprising an insulating layer to insulate and space-apart the balance electrode from the light emitting diode.

10. The organic light emitting display device of claim 9, wherein the first electrode is arranged on a same layer as the balance electrode.

11. The organic light emitting display device of claim 10, wherein the first electrode has a first electric potential, the second electrode has a second electric potential different from the first electric potential, and the balance electrode has a third electric potential different from either of the first and second electric potentials.

12. The organic light emitting display device of claim 11, wherein the third electric potential is higher than the second electric potential.

13. The organic light emitting display device of claim 9, wherein the balance electrode is arranged on a same layer as the second electrode.

14. The organic light emitting display device of claim 8, wherein the balance electrode comprises at least one material selected from a group consisting of indium tin oxide, indium zinc oxide, aluminum zinc oxide, gallium-doped zinc oxide, zinc tin oxide, gallium tin oxide and fluorine-doped tin oxide.

15. The organic light emitting display device of claim 8, wherein the balance electrode comprises at least one material selected from a group consisting of Mo, MoW, Cr, Al, AlNd and Al alloy.

16. The organic light emitting display device of claim 8, wherein the first electrode and the balance electrode are arranged on a same layer and are comprised of a same material.

17. The organic light emitting display device of claim 1, wherein the balance electrode, upon operation of the light emitting diode and upon being applied an electric potential different from that of each of the first and second electrodes, serves to maintain electron-hole charge balance within the organic light emitting layer by varying an amount of holes injected into the organic light emitting layer from the first electrode and an amount of electrons injected into the organic light emitting layer from the second electrode by varying an electric potential applied to the balance electrode.

18. The organic light emitting display device of claim 8, wherein the balance electrode, upon operation of the light emitting diode and upon being applied an electric potential different from that of each of the first and second electrodes, serves to maintain electron-hole charge balance within the organic light emitting layer by varying an amount of holes injected into the organic light emitting layer from the first electrode and an amount of electrons injected into the organic light emitting layer from the second electrode by varying an electric potential applied to the balance electrode.

19. The organic light emitting display device of claim 1, wherein the balance electrode serves to maintain electron-hole charge balance within the organic light emitting layer by decreasing an amount of holes injected into the organic light emitting layer from the first electrode and increasing an amount of electrons injected into the organic light emitting layer from the second electrode by applying an electric potential to the balance electrode that is higher than an electric potential being applied to the second electrode.

20. The organic light emitting display device of claim 8, wherein the balance electrode serves to maintain electron-hole charge balance within the organic light emitting layer by decreasing an amount of holes injected into the organic light emitting layer from the first electrode and increasing an amount of electrons injected into the organic light emitting layer from the second electrode by applying an electric potential to the balance electrode that is higher than an electric potential being applied to the second electrode.

* * * * *